United States Patent [19]
Li et al.

[11] Patent Number: 6,118,324
[45] Date of Patent: Sep. 12, 2000

[54] OUTPUT DRIVER WITH REDUCED GROUND BOUNCE

[75] Inventors: Richard C. Li, Cupertino; Hy V. Nguyen, San Jose, both of Calif.

[73] Assignee: Xilinx, Inc., San Jose, Calif.

[21] Appl. No.: 08/884,822

[22] Filed: Jun. 30, 1997

[51] Int. Cl.[7] .................................................. H03K 17/16
[52] U.S. Cl. .......................... 327/384; 327/108; 327/379; 327/227; 326/26; 326/27
[58] Field of Search .................................... 327/108, 112, 327/379, 384, 27, 170, 387, 392, 427, 437; 326/26, 27, 85

[56] References Cited

U.S. PATENT DOCUMENTS

| | | | |
|---|---|---|---|
| 5,144,161 | 9/1992 | Inaba | 326/26 |
| 5,319,252 | 6/1994 | Pierce et al. | 327/170 |
| 5,483,177 | 1/1996 | Van Lieverloo | 327/269 |

Primary Examiner—Dinh T. Le
Attorney, Agent, or Firm—Patrick T. Bever, Esq.; Edel M. Young

[57] ABSTRACT

An output driver circuit including a first path from an output pad to ground through a first switch, and a second path from the output pad to ground through series-connected second and third switches. The first switch is directly connected to a pull-down signal source, and one of the second and third switches is connected to the pull-down signal source through a one-shot circuit. In a pull-up state, the first and second switches are opened, and the one-shot circuit generates a stabilized output signal which closes the third switch. When the output driver circuit switches to a pull-down state, the first switch is closed, thereby connecting the output pad to ground via the first path. The signal change also closes the second switch. In addition, due to a propagation delay of the second signal through the one-shot circuit, the third switch initially remains closed, thereby also connecting the output pad to ground via the second path. The one-shot circuit then opens the third switch before the output pad fully discharges. Subsequently, the one-shot circuit returns to its stabilized state and closes the third switch, thereby connecting the substantially fully discharged output pad to ground through both the first and second paths.

16 Claims, 8 Drawing Sheets

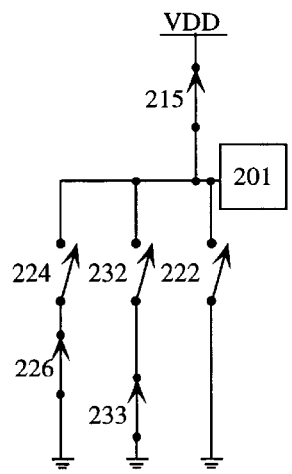 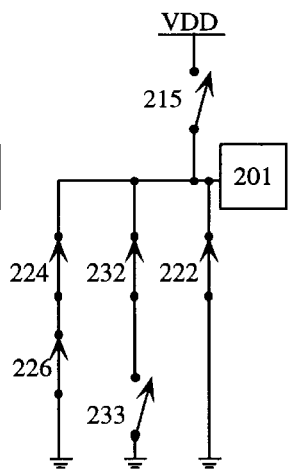 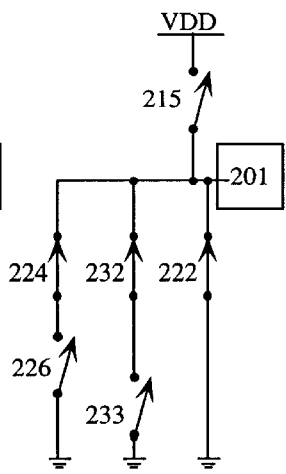 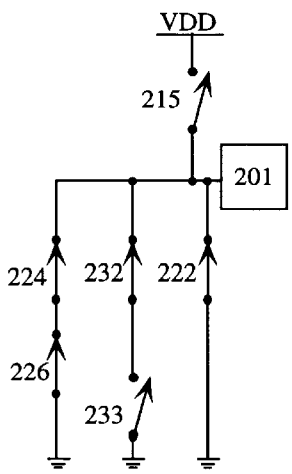
FIG. 3A    FIG. 3B    FIG. 3C    FIG. 3D
Soft Edge
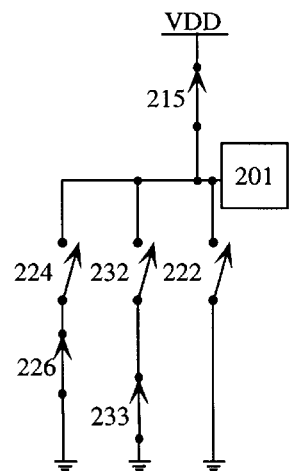 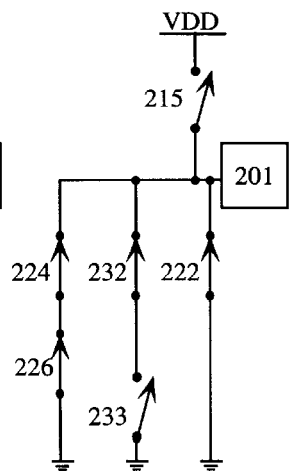 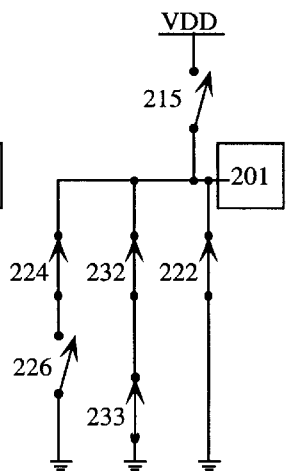 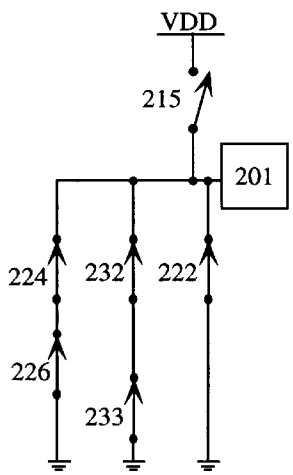
FIG. 3E    FIG. 3F    FIG. 3G    FIG. 3H
PCI

OUTPUT DRIVER WITH REDUCED GROUND BOUNCE

BACKGROUND OF THE INVENTION

1. Field of the Invention

The present invention relates to integrated circuit devices, and more specifically to an output driver circuit for integrated circuit devices.

2. Background Art

An integrated circuit (IC) is typically a small chip of semiconductor material upon which active and/or passive components have been fabricated and interconnected to form a functioning circuit. ICs are generally encapsulated with signal, power supply, and control pads (pins or terminals) accessible for connection to external electronic circuitry. Programmable logic devices (PLDs) are one type of IC in which the active/passive components are user-programmable to implement a desired logic function. Typically, input signals transmitted to a PLD via selected input or Input/output (I/O) pads are processed by the programmed array of active and/or passive components, and the processed signals are then applied to selected output or I/O pads using an output driver circuit. The output driver circuit raises (pulls up) or lowers (pulls down) a voltage level of the output or I/O pad in response to the processed signals generated by the programmed array, thereby providing logic "1" and "0" signals which are transmitted to the external circuitry connected to the output or I/O pad.

FIG. 1 is a circuit diagram showing a known output driver circuit 100 used, for example, in some of the PLDs produced by Xilinx, Inc. of San Jose, Calif. Output driver circuit 100 is controlled by a pull-up signal source 110 and a pull-down signal source 120 which generate non-overlapping signals. In a pull-up mode, the output driver circuit 100 connects an output (or I/O) pad 101 to a voltage source $V_{DD}$ through P-channel pull-up transistor 115, which has a channel width-to-length ratio of 400/0.5. Conversely, in a pull-down mode, the output driver 100 connects the output pad 101 to ground through a pull-down circuit 130, which is programmable to operate in either a "normal" operating mode or in a "soft-edge" operating mode.

The pull-down circuit 130 includes a first N-channel pull-down transistor 131 and a second N-channel pull-down transistor 132, both being connected between the output pad 101 and ground. The channel width-to length ratios for the first N-channel transistor 131 is 360/0.5, and that of the second N-channel transistor 132 is 108/0.5. The first pull-down transistor 131 has a gate connected directly to the pull-down signal source 120, and therefore conducts each time the pull-down signal source 120 generates a high signal. Signals applied to the gate of the second pull-down transistor 132 are controlled by memory circuit 133 whose output is connected to the gates of a first transmission gate 134 and a second transmission gate 135 using inverter 136. The first transmission gate 134 is connected between the pull-down signal source 120 and the gate of the second pass transistor 132. The second transmission gate 135 is connected to a third transmission gate 137, which in turn is connected to the output pad 101 through a resistor R1. The third transmission gate 137 is controlled by the pull-down signal source 120 and output of inverter 138, which is also connected to the gate of a third N-channel transistor 139. The third N-channel transistor 139 is connected between an output of the third transmission gate 137 and ground.

The output driver circuit 100 is typically programmed to operate in the "normal" operating mode when a user is more concerned about operating speed than with noise in the output signal. In the "normal" operating mode of the known output driver circuit 100, the memory circuit 133 is programmed to turn on first transmission gate 134 and to turn off second transmission gate 135. With the first transmission gate 134 turned on, the first and second pull-down transistors (131 and 132) are controlled by the pull-down signal source 120. Specifically, a high signal generated by the pull-down signal source 120 saturates both the first and second N-channel transistors (131 and 132), thereby allowing the voltage level on the output pad 101 to discharge at a relatively fast rate. However, in some situations this relatively fast discharge rate can result in a ground bounce (shifting of the voltage at ground terminals of the IC chip) which can generate improper output signals. For example, when too many output pads of a PLD are switched from $V_{DD}$ to ground simultaneously, the resulting load can create significant ground bounce.

To avoid ground bounce (when this is a problem), a user may selectively operate the output driver circuit 100 in the "soft-edge" operation mode. In this mode, the memory circuit 133 is loaded with a logic 1 value to turn off the first transmission gate 134 and to turn on the second transmission gate 135. With the second transmission gate 135 turned on, a portion of the voltage level on output pad 101 is fed back through resistor R1, third transmission gate 137 and second transmission gate 135 to the gate of second pull-down transistor 132. The third transmission gate 137 is controlled by the pull-down signal source using inverter 138 to turn on transistor 139.

When the signal generated by the pull-down signal source 120 is low, the first N-channel transistor 131 is turned off. In addition, this low signal turns off third transmission gate 137 and turns on the third N-channel transistor 139 (through the inverter 138). With the third N-channel transistor 139 turned on, the gate of the second N-channel transistor 132 is connected to ground, thereby turning off the second N-channel transistor 132. Thus, when source 120 is low, neither of transistors 131 or 132 pull down output pad 101.

When the signal generated by the pull-down signal source 120 switches from low to high, this high signal turns on the first N-channel transistor 131. In addition, this high signal turns on the third transmission gate 137 and turns off the third N-channel transistor 139, thereby effectively connecting the output pad 101 to the gate of second N-channel transistor 132. Because the voltage level of the output pad 101 is $V_{DD}$ at this time, the second N-channel transistor 132 is also turned on. Therefore, at this initial point following the transition of the pull-down signal 120 from low to high, the discharge rate of the output pad 101 is substantially at the same relatively fast discharge rate achieved in the "normal" operating mode. However, as the output pad 101 discharges, the voltage level fed back to the gate of the second N-channel transistor 132 is correspondingly reduced, thereby gradually turning off the second N-channel transistor 132. This attempts to produce the desired "soft-edge" effect by reducing the discharge rate of the output pad 101 as the voltage level of the output pad 101 approaches the ground level. A structure similar to FIG. 1 is also described by Pierce, et al. in U.S. Pat. No. 5,319,252, commonly assigned.

A problem with the known output driver circuit 100 occurs because the second N-channel transistor 132 turns off before the voltage level of the output pad 101 reaches the ground potential, and remains turned off after the output pad 101 is at the ground potential. In particular, the second N-channel transistor 132 turns off during discharge when the voltage level of the output pad 101 falls below the threshold voltage $V_{Th}$ of the second N-channel transistor 132, and remains turned off thereafter. Because the second N-channel transistor 132 is off when the output voltage is at the ground potential, the channel width-to-length ratio of the first N-channel transistor 131 is necessarily larger (as mentioned above, approximately 3 times larger) than that of the second N-channel transistor 132 in order to meet D.C. output specifications. This difference creates sudden changes in capacitive load on the gate of the first N-channel transistor 131 when the first transmission gate 134 turns off, thereby increasing the discharge rate through the first N-channel transistor 131. This sudden increase in discharge rate can result in ground bounce.

SUMMARY OF THE INVENTION

In accordance with the present invention, an output driver circuit is provided for an integrated circuit which overcomes the shortcomings of the known output driver circuit by initially discharging (or charging) an output pad using two paths, then disconnecting one of the paths before the output pad is fully discharged (or charged), and subsequently reconnecting the second path when the output pad is substantially fully discharged (or charged). By disconnecting one of the paths during discharge (or charge), the rate of discharge (or charge) is reduced, thereby providing the desired "soft-edge" effect. In addition, because the second path is connected when the output pad is fully discharged (or charged), the output pad will meet D.C. output specifications without using a transistor having a large width-to-length ratio in the first discharge path. Consequently, the slew rate of the first path is not significantly altered when the second path is turned off, thereby producing an improved "soft-edge" effect in comparison with known output driver circuits.

In accordance with a first aspect of the invention, an output driver circuit includes a first path from an output pad to a first voltage source (such as ground or $V_{DD}$) which passes through a first switch, and a second path from the output pad to the first voltage source through series-connected second and third switches. The first and second switches are directly controlled by a signal source (such as a pull-down signal source or a pull-up signal source), and the third switch is controlled by a one-shot circuit (monostable multivibrator) connected to the signal source.

In response to a low first signal generated by the signal source, the first and second switches are turned off. At the same time, the one-shot circuit generates a stabilized output signal which turns on the third switch.

Immediately after the signal source generates a high signal, the first switch is turned on, thereby connecting the output pad to the voltage potential (ground) via the first path. The signal change also turns on the second switch. In addition, due to a propagation delay of the second signal through the one-shot circuit, the third switch initially remains on, thereby also connecting the output pad to the ground voltage source via the second path. The one-shot circuit then turns off the third switch before the output pad fully discharges (or charges), thereby producing the "soft-edge" effect by reducing the discharge rate. Subsequently, the one-shot circuit returns to its stabilized state and closes the third switch, thereby connecting the substantially fully discharged output pad to ground through both the first and second paths.

In a second embodiment of the present invention, an output of the one-shot circuit is connected to the gate of the third switch through a transmission gate which is controlled by a memory circuit. This allows a user to select between a "normal" mode, in which the one-shot circuit is isolated and the third switch is connected to a second voltage potential, and a "soft-edge" mode in which the third switch is controlled by the output from the one-shot circuit.

BRIEF DESCRIPTION OF THE DRAWINGS

These and other features, aspects and advantages of the present invention will become better understood with regard to the following description, appended claims, and accompanying drawings.

FIGS. 3A through 3D are simplified diagrams showing a sequence of switching stages employed by the output driver circuit shown in FIG. 2 for soft edge switching.

FIGS. 3E through 3H show switching states for faster switching compatible with the PCI standard.

DETAILED DESCRIPTION

In accordance with the present invention, an output driver circuit is provided for an integrated circuit (IC) which provides a "soft-edge" effect by momentarily opening one of a plurality of discharge paths using a one-shot circuit (monostable multivibrator). The disclosed output driver circuit is particularly intended for use in the input/output (I/O) circuitry of programmable logic devices (PLDS) where a large number of output signals are often switched simultaneously. Those of ordinary skill in the art would recognize that the disclosed output driver circuit could also be used in other IC types.

Figure 1:
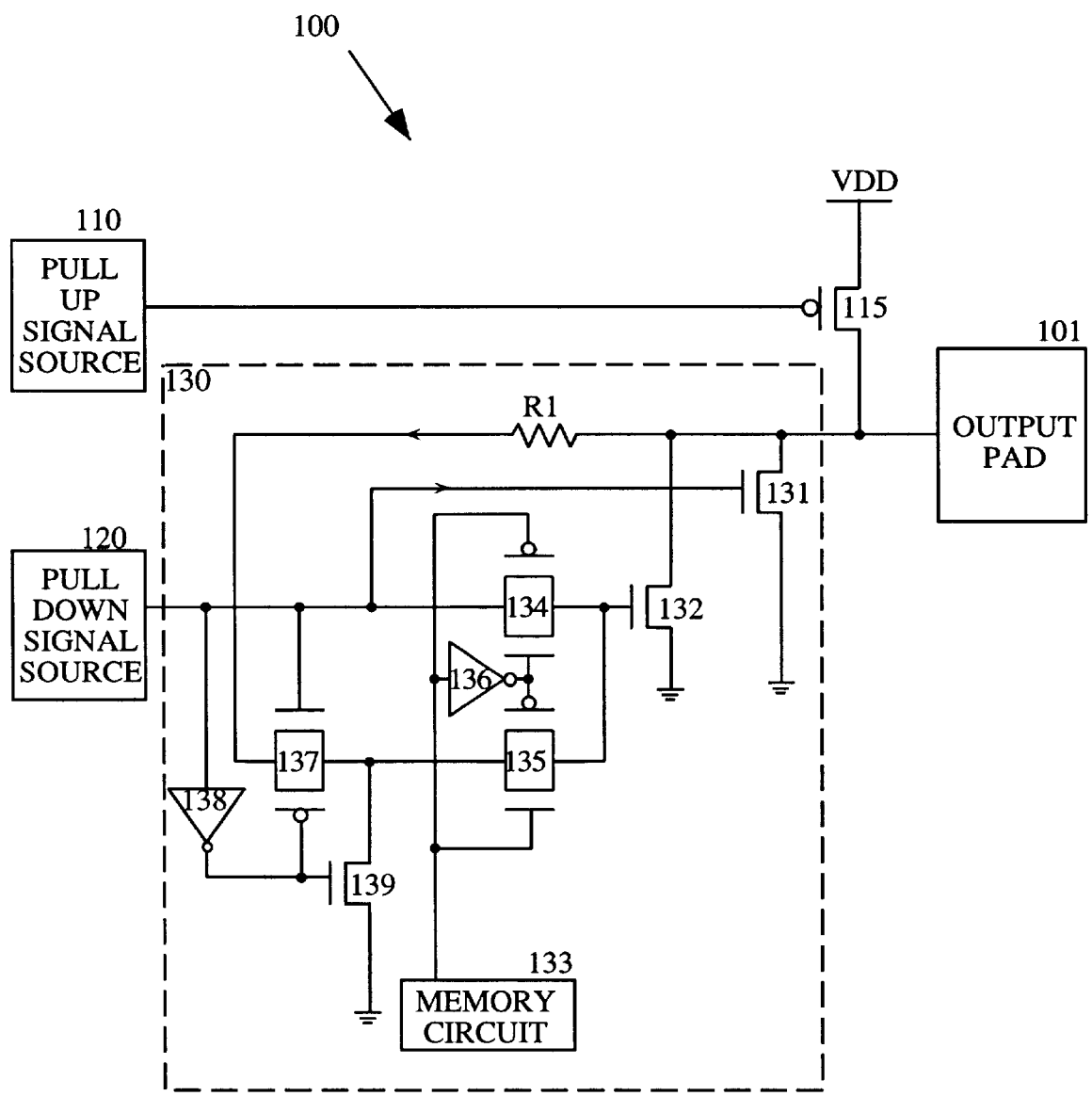
FIG. 1 is a circuit diagram showing a known output driver circuit.
Figure 2:
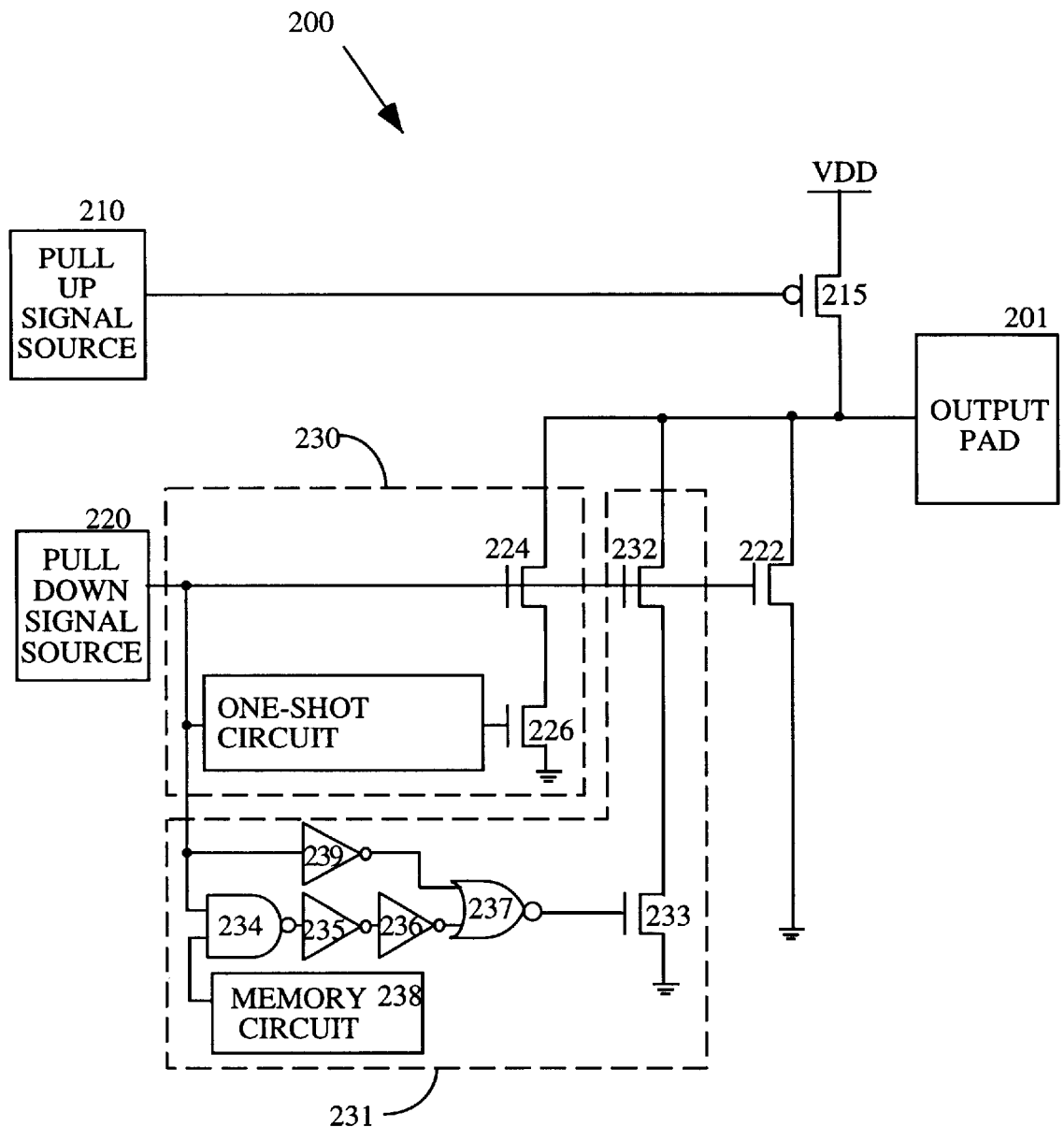
FIG. 2 is a circuit diagram showing an output driver circuit in accordance with a first embodiment of the present invention.
Figure 4:
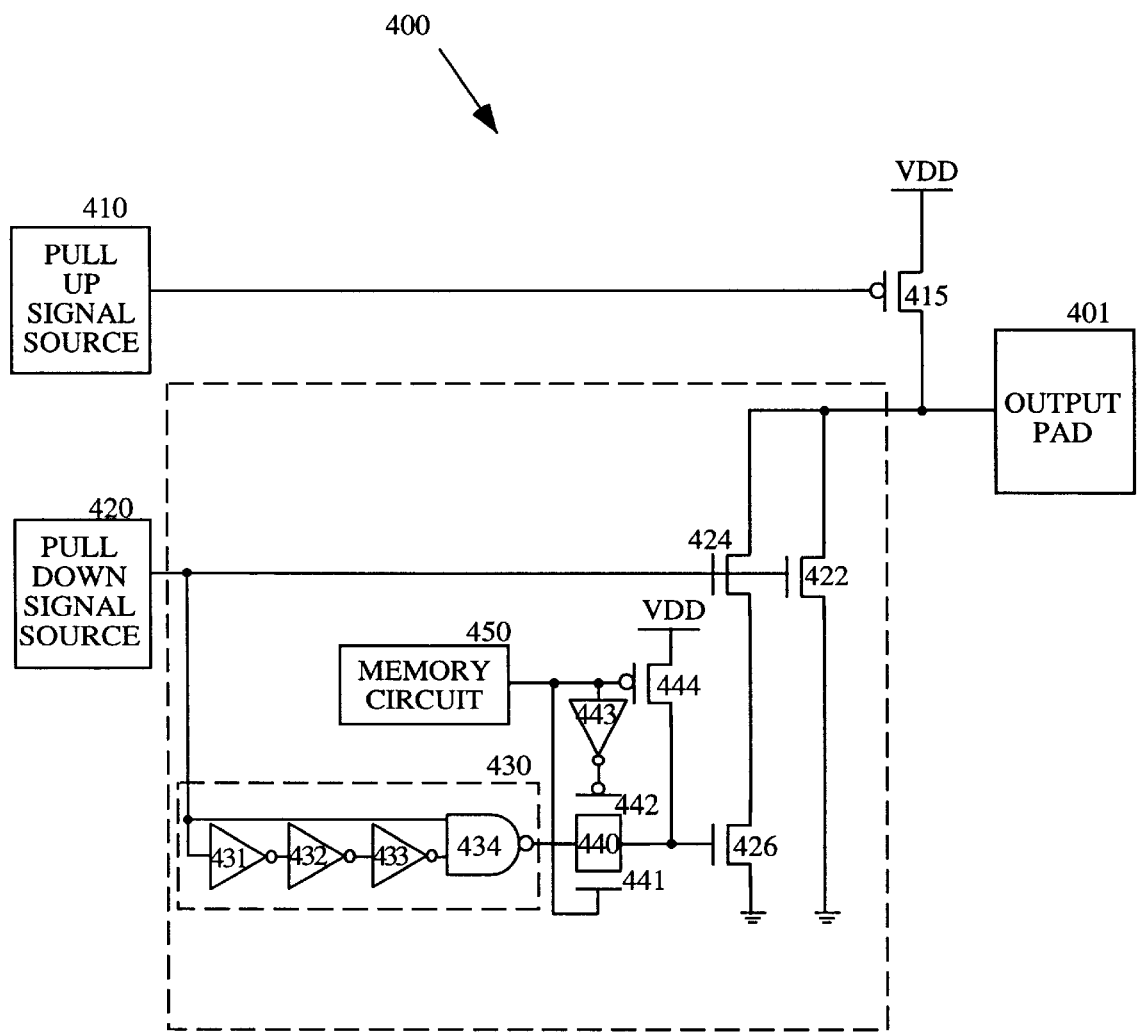
FIG. 4 is a circuit diagram showing an output driver circuit in accordance with a second embodiment of the present invention.

FIG. 2 is a circuit diagram showing an output driver circuit 200 in accordance with a first embodiment of the present invention. The output driver circuit 200 is controlled by signals from a pull-up signal source 210 and a pull-down signal source 220 which are, for example, incorporated into the I/O circuitry of a PLD. The pull-up signal source 210 is connected to the gate of a pull-up switch (P-channel pass transistor) 215 which has a first terminal connected to a first voltage source ($V_{DD}$) and a second terminal connected to an output pad 201 of the PLD (or other IC). The pull-down signal source 220 is connected to the gates of a first pull-down switch (N-channel pass transistor) 222 and a second pull-down switch (N-channel pass transistor) 224. In addition, the pull-down signal source is connected to the input of a one-shot circuit (monostable multivibrator) 230, whose output is connected to the gate of a third pull-down switch (N-channel pass transistor) 226. One shot 230 can be formed as shown in FIG. 4 for one-shot 430. the first pull-down switch 222 has a first terminal connected to ground and a second terminal connected to the output pad 201, thereby forming a first discharge path. The second pull-down switch 224 has a first terminal connected to the output pad 201 and a second terminal connected to a first terminal of the third pull-down switch 226 which also has a second terminal connected to the second voltage source, thereby forming a second discharge path. A third path is formed from fourth and fifth pull-down switches 232 and 233. Switch 233 is controlled by delay circuit 231. As indicated in FIG. 2, the three discharge paths are connected in parallel between the output pad 201 and ground.

The purpose of one-shot circuit 230 and delay circuit 231 is to control the pull-down rate in response to a change in the pull-down signal. Circuits 230 and 231 control the number of paths through which the signal is pulled down. These two circuits have different characteristics. Delay circuit 231 is controlled by memory circuit 238. When memory circuit provides a low output signal, delay circuit 231 is disabled and transistor 233 is permanently off. In this case the circuit performs as though delay circuit 231 were not present.

Figure 2A:
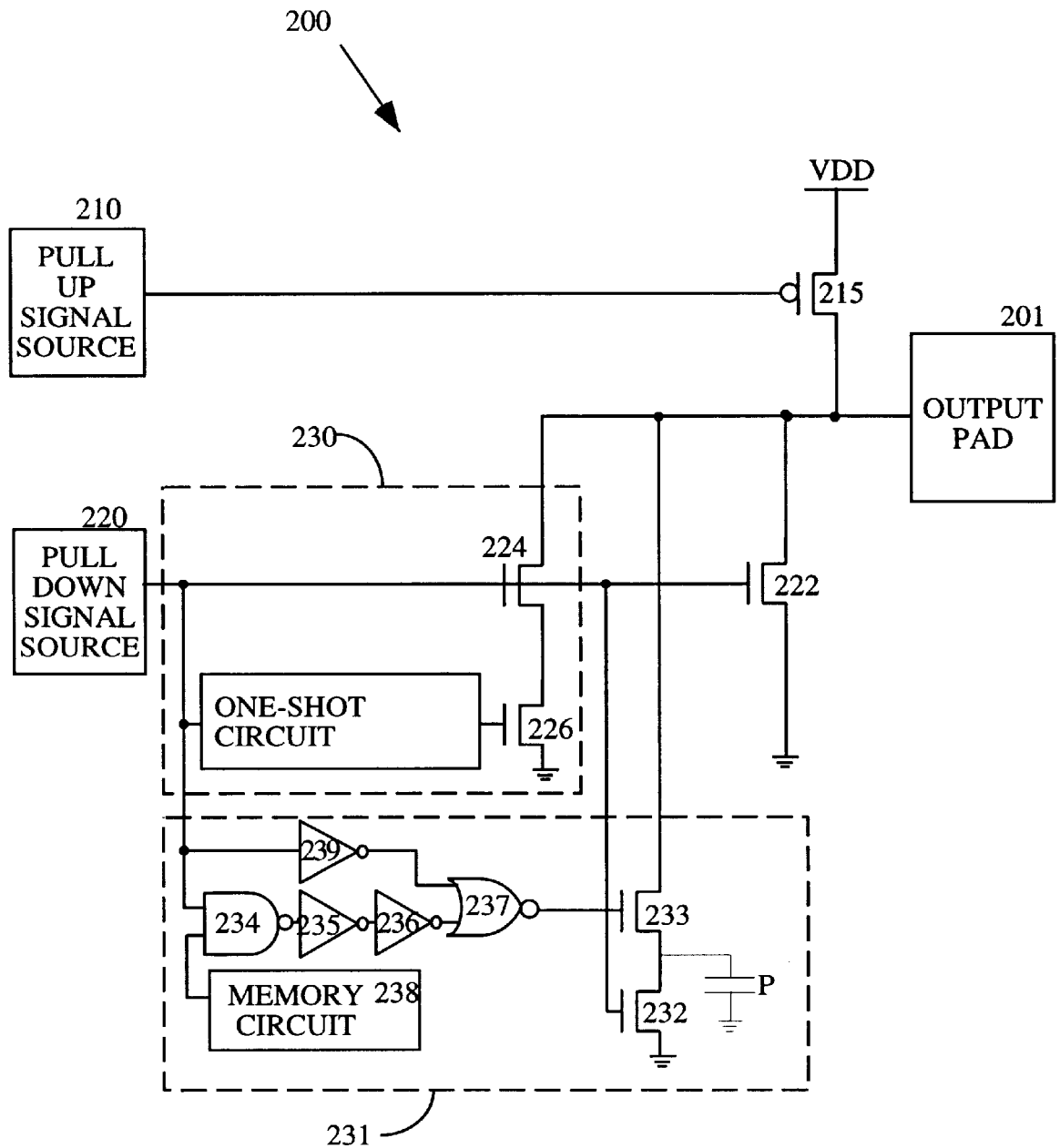
FIGS. 2A and 2B show alternatives to this embodiment.
Figure 2B:
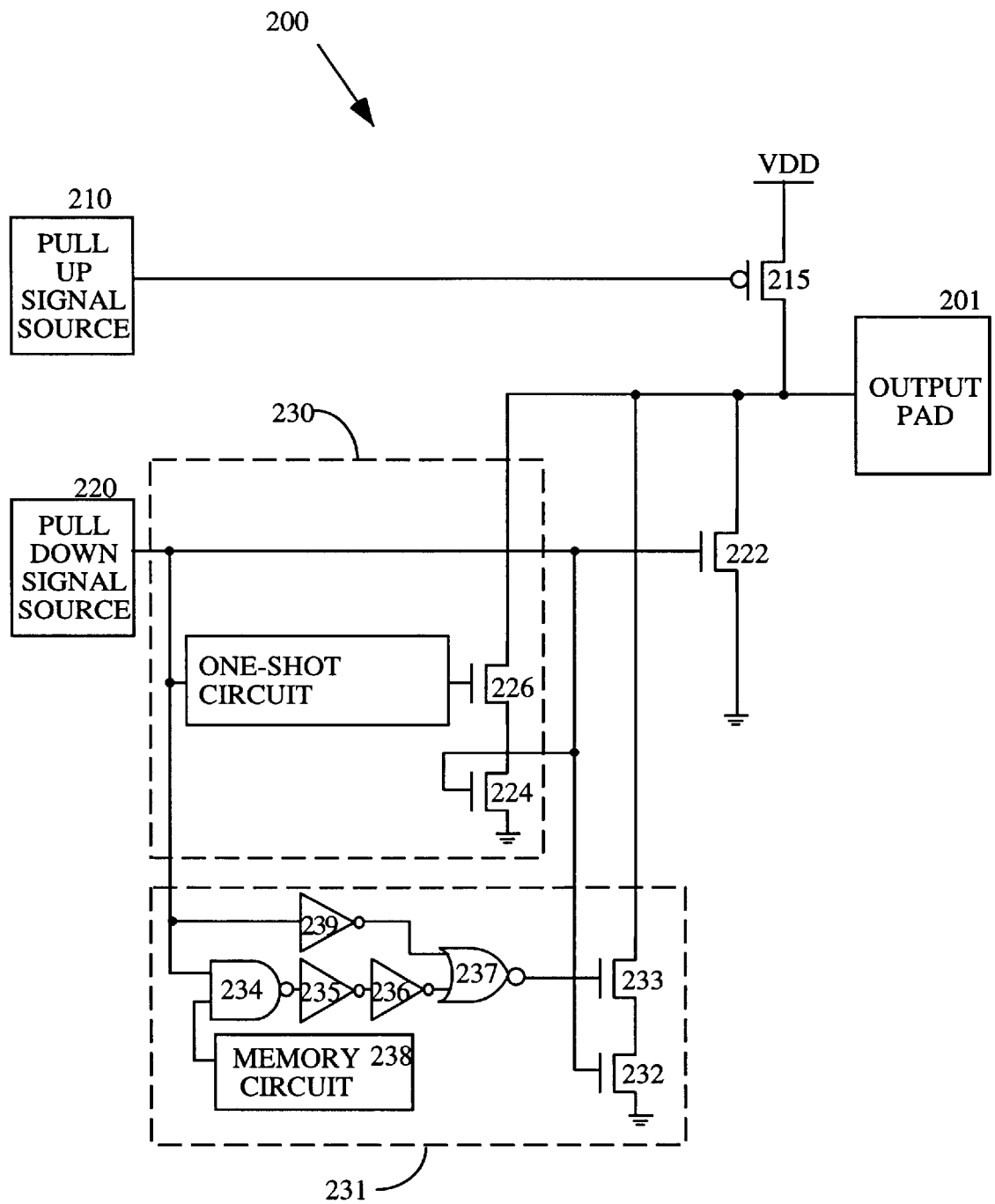

FIGS. 2A and 2B show alternative implementations of the embodiment of FIG. 2.

In FIG. 2A, transistor 232 is placed between transistor 233 and ground rather than between transistor 233 and output pad 201. Thus, when delay circuit 231 is disabled by turning off transistor 233, the source and drain of transistor 232 are at or near ground potential, and a switching signal from pull down signal source 220 is not slowed by the parasitic capacitance P of transistor 232. Thus transistor 222 switches more quickly to begin pulling down pad 201.

In FIG. 2B, transistor 224 is placed between transistor 226 and ground rather than between transistor 226 and pad 201. Either position is acceptable.

One-shot circuit 230 is preferably formed as shown in FIG. 4 for one-shot circuit 430. Referring now to one-shot circuit 430 in FIG. 4, when pull down source 420 has been high, inverter 433 is providing a low input signal to NAND gate 434. Thus a low-going signal at pull-down signal source 420 is received immediately by NAND gate 434 and immediately causes NAND gate 434 to output a high signal. After a delay period, the low-going signal propagates through inverters 431, 432, and 433 and provides a high input signal to the other terminal of NAND gate 434, which simply retains the already high output signal from NAND gate 434. Thus if transmission gate 440 is on, transistor 426 remains on ir response to a low-going signal from pull down source 420 and applies a second pull-down current path to output pad 401.

On the other hand, a high-going pull-down signal from pull down source 420 causes one-shot 430 to generate a pulse. When pull down source 420 has been low, the output of inverter 433 is high. The high going signal is applied directly to NAND gate 434, resulting in two high input signals before the signal has had a chance to propagate through inverters 431, 432, and 433. Thus, for a brief period, two high input signals to NAND gate 434 cause NAND gate 434 to produce a low output signal. Thus the response of one-shot 430 is asymmetrical, with a low pulse in response to a high-going signal from pull down source 420 and no change in response to a low-going signal from pull down source 420. This pulse momentarily turn-off the second path through pull-down switches 224 and 226, thereby providing the "soft-edge" effect but avoiding ground bounce. In its stable condition, the one-shot circuit 230 provides a path through pull-down switches 224 and 226. When the pull-down signal chances from a first (e.g., 0 volt) state to a second (e.g., 5 volt) state, the one-shot circuit 230 causes the second path to remain on for a first brief period while the potential on output pad 201 is discharged rapidly through both pull-down switch 222 and series-connected pull-down switches 224 and 126. After this first brief period, one-shot circuit 230 turns off pull-down switch 226 for a second brief period before the potential of output pad 201 reaches ground, thereby leaving pull-down switch 222 as the only discharge path. By turning off pull-down switch 226, one-shot circuit 230 produces the "soft-edge" effect by reducing the discharge rate as the potential of output pad 201 approaches ground, thereby suppressing the tendency for overshoot and the generation of noise. Finally, after the second brief period, one-shot circuit 230 returns to its stable condition, thereby again turning on third pull-down switch 226, and allowing the potential on output pad 201 to finish discharging through two paths.

Regarding delay circuit 231 in FIG. 2, if memory circuit 238 outputs a high signal, NAND gate 234 acts as an inverter and delay circuit 231 is operational. Delay circuit 231 produces an output signal from NOR gate 237 that falls promptly in response to a falling signal from pull down signal source 220 but rises belatedly in response to a rising signal from pull down signal source 220. This is because a falling signal from pull down signal source 220 causes inverter 239 to output a high signal, which immediately causes NOR gate 237 to output a low signal. A rising signal from pill down signal source 220 causes a prompt low signal from inverter 239, but this does not immediately cause NOR gate 237 to output a high signal because the output of inverter 236 does not go high until the signal from pull down signal source 220 has propagated through NAND gate 234 and inverter 235. (The amount of delay can be increased by adding an even number of inverters to the chain, by adding capacitance to the chain, or by making the inverters more resistive, all of which is well known.) Thus, when pull down signal source 220 goes low, transistors 232 and 233 turn off promptly, hut when pull down signal source 220 goes high, there is a delay before transistor 233 turns on to increase the pull-down strength applied to output pad 201.

There are situations in which the slower transition and reduced ground bounce are desired and situations in which a faster transition is desired. Memory circuit 238 allows a user to choose between two modes. When memory circuit 238 outputs a logic 0, delay circuit 231 is disabled and a soft edge with reduced ground bounce occurs. When memory circuit 238 outputs a logic 1, the pull-down is faster and meets a PCI (peripheral component interface) standard.

Soft Edge

FIGS. 3A through 3D are simplified diagrams showing the above-described sequence of switching stages employed by output driver circuit 200 shown in FIG. 2 when delay circuit 231 is disabled, thus producing a soft edge signal transition.

FIG. 3A shows a first switching stage at a time $t_0$ in which the pull-up signal is in a low state which causes pull-up switch 215 to be on, and the pull-down signal is in a low state which causes first and second pull-down switches 222 and 224 to be off, thereby maintaining the potential on the output pad 201 at $V_{DD}$. In the first stage, the one-shot circuit 230 is in the stable condition in which the one-shot circuit 230 generates a high signal which turns on third pull-down switch 226.

FIG. 3B shows a second stage at a time $t_1$ immediately after the pull-up signal source 210 and pull-down signal source 220 are switched high such that the p-ll-up signal turns off pull-up switch 215, and the pull-down signal turns on first and second pull-down switches 222 and 224. In the second stage, the voltage on output pad 201 is connected (pulled down) to the ground potential (second voltage source) through pull-down switch 222. In addition, propagation of the pull-down signal through the one-shot circuit 230 is delayed (based on normal operation of the one-shot circuit 230), thereby causing the one-shot circuit 230 to momentarily remain on. While third pull-down switch 226 is on, output pad 201 is pulled down through a second path through switches 224 and 226. In other words, output pad 201 is simultaneously connected to ground via parallel first and second paths such that discharge (voltage change) of the output pad 201 occurs at a relatively fast rate.

FIG. 3C shows a third stage at a time $t_2$ which occurs a predetermined period of time after $t_1$, and before the voltage level of the output pad 201 reaches the second voltage level (that is, while the output pad 201 is initially discharging). In the third stage, the one-shot circuit 230 changes from the stabilized condition and opens the third pull-down switch 226, thereby reducing the rate of discharge (voltage change) from the output pad 201 from the first discharge rate (see FIG. 3B) to a second discharge rate. The second discharge rate is less than the first discharge rate because discharge from the output pad 201 only occurs through the first path. This creates the "soft-edge" effect of the voltage level at the output pad 201 which reduces the possibility of ground bounce.

FIG. 3D shows a fourth stage at a time $t_3$, which occurs a predetermined period of time after $t_2$, in which the one-shot circuit 230 returns to the high output condition. In the fourth stage, the one-shot circuit 230 turns on the third-pull down switch 226, thereby reconnecting output pad 201 to the ground potential via the second path (i.e., through the series-connected second pull-down switch 224 and third pull-down switch 226). This allows output driver circuit 200 to meet D.C. specifications while reducing the channel width-to-length ratio of the first N-channel transistor 222.

PCI Compatible Switching

FIGS. 3E through 3H show switch positions when delay circuit 231 is enabled. Delay circuit 231 adds another pull-down path to the pull-down circuit and thus causes a signal transition to occur within the required 5 ns, time period required by PCI.

The switching sequence of FIGS. 3E and 3F is the same as that of FIGS. 3A and 3B. In FIG. 3G, switch. 226 is turned off as before but switch 233 is turned on and therefore increases the transition speed over that in FIG. 3C. The configuration remains the same in FIG. 3H. Thus a higher speed transition to 0 volts occurs than occurs in the sequence of FIGS. 3A–3D.

Second Embodiment

FIG. 4 is a circuit diagram showing an output driver circuit 400 in accordance with a second embodiment of the present invention. Similar to the output driver circuit 200 of FIG. 2, the output driver circuit 400 is controlled by signals from a pull-up signal source 410 and a pull-down signal source 420. The pull-up signal source 410 is connected to the gate of an P-channel pull-up transistor 415 which has a channel width-to-length ratio of 400/0.5. The pull-down signal source 420 is connected to the gates of a first N-channel pull-down transistor 422 which has a channel width-to-length ratio of 200/0.5, and to a second N-channel pull-down transistor 424 which has a channel width-to-length ratio of 300/0.5. The pull-down signal source 420 is also connected to the input of a one-shot circuit 430, whose output is connected through a transmission gate 440 to the gate of a third N-channel pass transistor 426, which also has a channel width-to-length ratio of 300/0.5.

The one-shot circuit 430 includes an ode-number of series-connected inverters (in this embodiment, 431, 432 and 433) which are connected to one input of NAND gate 434. A second input of the NAND gate 434 is connected directly to the pull-down signal source 420. In operation, when the pull-down signal is low, the series-connected inverters apply a high signal to the first input of NAND gate 434, while the low pull-down signal is applied to the second input of the NAND gate 434, thereby causing an output of the one-shot circuit 430 to be high. When the pull-down signal changes from low to high, the high signal is applied immediately to the second input of the NAND gate 434. A short delay as the pull-down signal passes through the series connected inverters causes the NAND gate 434 to momentarily receive high signals on both of its inputs, thereby causing the one-shot circuit 430 to momentarily produce a low output signal. Thereafter, the high pull-down signal propagates through the series-connected inverters and applies a low signal to the first input of the NAND gate 434, thereby causing the one-shot circuit 430 to produce a high output signal. This high-low-high sequence of output signals from the one-shot circuit is used to control the second discharge path (through N-channel transistors 424 and 426) to generate the "soft-edge" effect while meeting the required D.C. specifications (e.g., the V:I curves) of the environment to which the output driver circuit 400 is connected.

Transmission gate 440 is controlled by a memory circuit 450 to alter the output driver circuit 400 between the "soft-edge" operating mode and a "normal" operating mode. In the "soft-edge" mode, the memory circuit 450 generates a high signal which turns on N-channel transistor 441 and P-channel transistor 442 (via inverter 443), thereby transmitting the output from the one-shot circuit 430 to the gate of third N-channel transistor 426. Both N-channel transistor 441 and P-channel transistor 442 of transmission gate 140 have channel width-to-length ratios of 50/0.5. In the "normal" operating mode, memory circuit 450 generates a low signal which turns off N-channel transistor 441 and P-channel transistor 442, and turns on P-channel transistor 444, which also has a channel width-to-length ratio of 50/0.5. P-channel transistor 444 is connected between $V_{DD}$ and the gate of third N-channel transistor 426. When on, P-channel transistor 444 applies $V_D$ to the gate of third N-channel transistor 426.

The output driver circuit 200 of FIG. 2 can meet the PCI electrical specification for both 3.3V and 5V signaling environments, by selecting actual channel widths which satisfy the V:I curves provided for both of these environments. Briefly, PCI requires that a signal move from 5 volts to 0 volts in no less than 1.25 ns and no more than 5 ns and that the signal not bounce below 0 volts during this transition.

Figure 5:
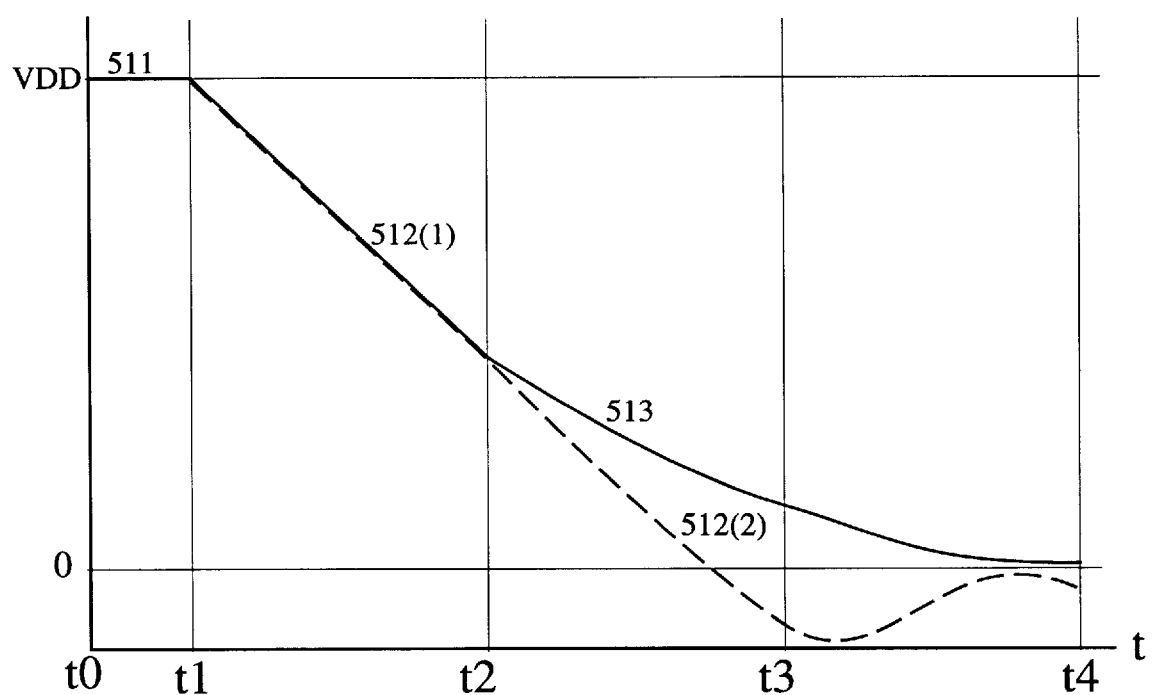
FIG. 5 is a timing diagram showing a change in the voltage level applied to an output pad of an IC in accordance with the switching stages shown in FIGS. 3A through 3D.

FIG. 5 is a timing diagram showing operation of the output driver circuit 400 in the "soft-edge" mode. Also shown in FIG. 5 is a curve compatible with PCI mode. Because operation of the output driver circuit 400 in the "soft-edge" mode is similar to the above-described operation of the output driver circuit 200, reference is made to the switching stages shown in FIGS. 3A through 3D for the soft edge mode and to the switching stages shown in FIGS. 3E through 3H for the PCI mode. The voltage levels, discharge rates end time periods described below are consistent with the output driver circuit 400.

Referring to FIG. 5, at time to, the output driver circuit 400 is maintained in the first switching state shown in FIG. 3A, and the output pad is maintained at $V_{DD}$ (as indicated by segment 511). At time $t_1$, the output driver circuit 400 is switched to the second state shown in FIG. 3B, and the voltage level at the output pad 401 begins to discharge at the first (relatively rapid) rate of approximately 2–3 volts/ nanosecond, which is illustrated by segment 512(1). The first, second and third pull-down switches (422, 424 and 426) are sized such that the first discharge rate of the output pad 401, if not subjected to the "soft-edge" effect, could cause the voltage level at the output pad 501 to move sharply toward ground, thereby creating noise and possible ground bounce, as illustrated by the dashed segment 511(2). However, at time $t_2$ (approximately 0.5 to 1 nanosecond after $t_1$), when the voltage level of the output pad 401 falls to approximately 200 millivolts, the output driver circuit 400 is switched from the second stage to the third stage shown in FIG. 3C, thereby slowing the rate of discharge (to approximately 1 volt/nanosecond) as indicated by segment 513 such that the voltage level at the output pad 401 does not overshoot the ground level. Finally, at times $t_3$ (approximately 2–3 nanoseconds after $t_2$), when the voltage level is slightly above or at ground level, the output driver circuit 200 switches to the fourth stage shown in FIG. 3D.

The curve 512(2) of FIG. 5 illustrates he performance of the circuit of FIG. 2 when in PCI mode and pulled more sharply toward ground by the switching pattern illustrated in FIGS. 3E through 3H.

Figure 6:
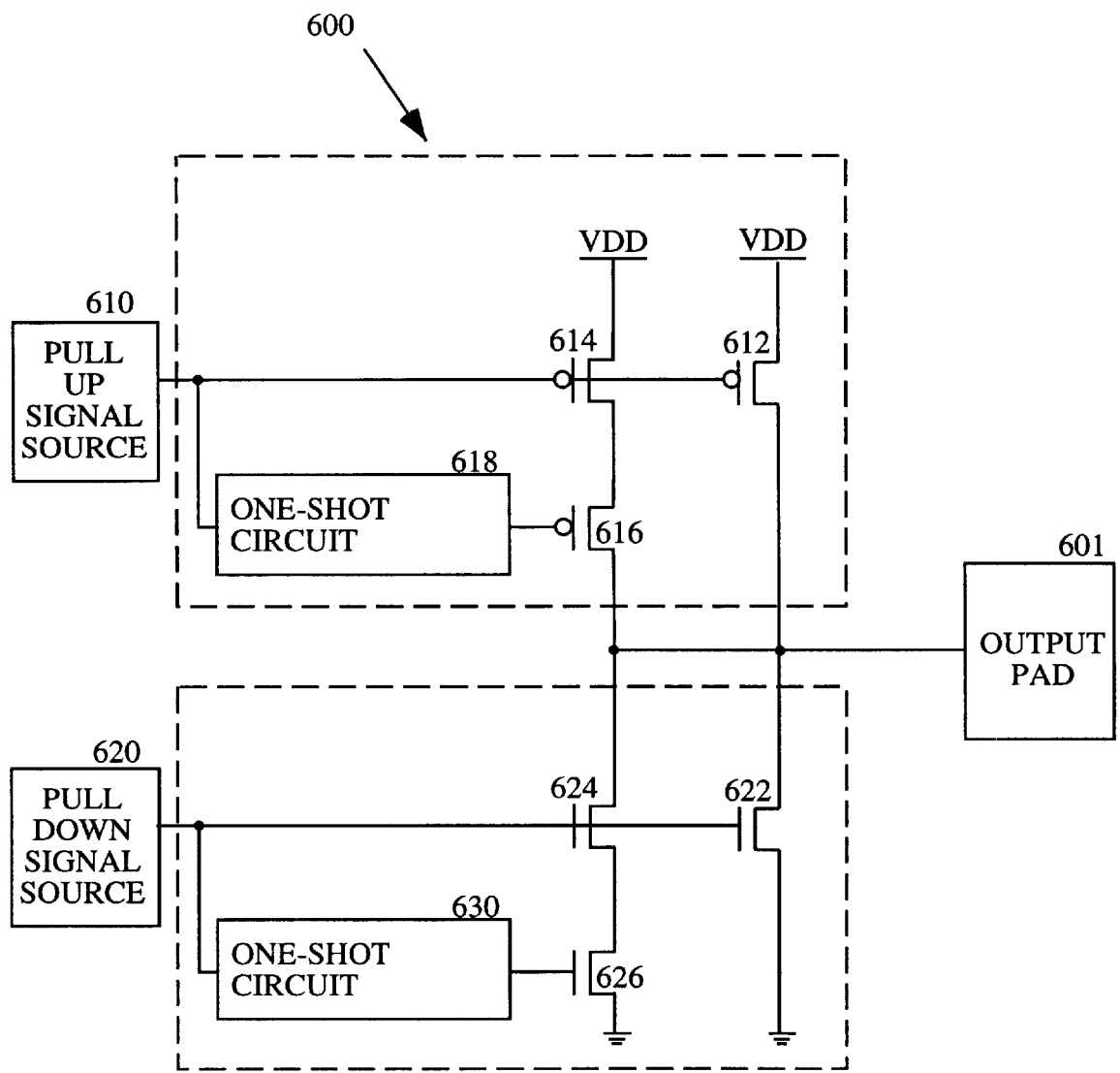
FIG. 6 is a circuit diagram showing an output driver circuit in accordance with a third embodiment of the present invention.

FIG. 6 is a circuit diagram showing an output driver circuit in accordance with a third embodiment of the present invention. The output driver circuit 600 is controlled by signals from a pull-up signal source 610 and a pull-down signal source 620. Similar to the output driver circuit 200 (discussed above), the pull-down signal source 620 is connected to the gates of a first N-channel pass transistor 622 and a second N-channel pass transistor 624, and also through a first one-shot circuit 630 to the gate of a third N-channel pass transistor 626. The output pad 601 is connected to a node common to the drains of first N-channel transistor 622 and second N-channel transistor 624. Operation of the pull-down portion of output driver circuit 600 (i.e., the transistors driven by pull-down signal source 620) is the same as that described above with respect to output driver circuit 200.

Output driver circuit 600 differs from the earlier-described embodiments in that pull-up signal source 610 is connected to the gates of a first P-channel pass transistors 612 and a second P-channel pass transistor 614, and also through a second one-shot circuit 618 to the gate of a third P-channel pass transistor 616. Output pad 601 is connected to a node common to drains of first P-channel transistor 612 and second P-channel transistor 614. First P-channel transistor 612 is also connected to $V_{DD}$, and second P-channel transistor 614 is connected in series with the third P-channel transistor 616, to $V_{DD}$. Operation of the pull-up portion of the output driver circuit 600 (i.e., the transistors driven by the pull-up signal source 610) is similar to that of the pull-down portion with the exception that closing the P-channel transistors 612, 614 and 616 pulls the output pad 601 up rather than down to $V_{DD}$.

A benefit of the output driver circuit 600 is that noise is reduced when the output driver switches from low to high, thereby improving performance when the reduction of such switching noise is important.

Although the present invention has been described in considerable detail with reference to certain preferred embodiments, other embodiments are possible. For example, a NOR-based one-shot circuit may be used in place of the NAND-based one-shot circuit 430 shown in FIG. 4. Likewise, the delay circuit 231 of FIG. 2 can be replaced with other delay circuits using other types of gates. And the bilateral pull-up and pull-down circuits of FIG. 6 can be replaced by other circuits having both one-shot and delay circuits. In addition, any equivalent circuit may be used in place of the one-shot circuit to provide a short turn-off period utilized in the present invention. Further, switches other than the disclosed field effect transistors may be used to produce the output driver circuit. In view of this and other possible alternative embodiments, the spirit and scope of the appended claims should not be limited to the description of the preferred embodiments contained herein.

We claim:

1. An output driver circuit for selectively changing a voltage level applied to an output pad of an integrated circuit device from a first voltage level to a second voltage level, the output driver circuit comprising:

a first switch having a gate terminal connected to a signal source, a first terminal connected to a first voltage source, and a second terminal connected to the output pad;

a second switch having a gate terminal connected to the signal source, a first terminal connected to the output pad, and a second terminal;

a one-shot circuit having an input terminal connected to the signal source and an output terminal; and a third switch having a gate terminal connected to the output terminal of the one-shot circuit, a first terminal connected to the second terminal of the second switch, and a second terminal connected to the first voltage source;

wherein, during a first switching stage that occurs immediately after the signal source switches from a first state to a second state that turns on the first and second switches, the one-shot circuit turns on the third switch such that current flows between the first voltage source and the output pad through the first, second and third switches;

wherein, during a second switching stage that occurs a first predetermined period after a beginning of the first stage, the one-shot circuit turns off the third switch such that current flows between the first voltage source and the output pad through the first switch; and wherein, during a third switching stage that occurs a second predetermined period after a beginning of the second switching stage, the one-shot circuit turns on the third switch to connect the output pad to the first voltage source through the first, second and third switches.

2. The output driver circuit according to claim 1, wherein the first, second and third switches comprise N-channel field effect transistors.

3. The output driver circuit according to claim 2, wherein the first N-channel field effect transistor has a channel width-to-length ratio of 200/0.5, and the second and third N-channel field effect transistors have a channel width-to-length ratio of 300/0.5.

4. An output driver circuit for selectively changing a voltage level applied to an output pad of an integrated circuit device from a first voltage level to a second voltage level, the output driver circuit comprising:

a first switch having a gate connected to a signal source, a first terminal connected to a first voltage source, and a second terminal connected to the output pad;

a second switch having a gate connected to the signal source, a first terminal connected to the output pad, and a second terminal;

a one-shot circuit having an input connected to the signal source and an output; and a third switch having a gate connected to the output of the one-shot circuit, a first terminal connected to the second terminal of the second switch, and a second terminal connected to the first voltage source;

a fourth switch having a first terminal connected to said first voltage source and having a second terminal and a gate;

a fifth switch having a first terminal connected to said second terminal of said fourth switch, having a second terminal connected to said output pad and having a gate;

one of said gates of said fourth switch and said fifth switch being controlled by said signal source and the other of said gates of said fourth switch and said fifth switch being controlled by a delay circuit.

5. The output driver circuit according to claim 4 wherein said delay circuit is enabled by a memory cell.

6. The output driver circuit, according to claim 4 wherein said gate of said fourth switch is controlled by said signal source and said gate of said fifth switch is controlled by said delay circuit.

7. The output driver circuit according to claim 4 wherein said gate of said fourth switch is controlled by said delay circuit and said gate of said fifth switch is controlled by said signal source.

8. An output driver circuit for selectively changing a voltage level applied to an output pad of an integrated circuit device from a first voltage level to a second voltage level in response to a control signal, the output driver circuit comprising:

a first switch controlled by the control signal such that the first switch is open when the control signal is in a first state and closed when the control signal is in a second state, the first switch having a first terminal connected to a first voltage source and a second terminal connected to the output pad;

a second switch controlled by the control signal such that the second switch is open when the control signal is in the first state and closed when the control signal is in the second state, the second switch having a first terminal connected to the output pad, and a second terminal;

a third switch having a first terminal connected to the second terminal of the second switch, and a second terminal connected to the first voltage source; and means for controlling the third switch in response to the control signal such that the third switch is closed when the control signal is in the first state, and when the control signal changes from the first state to the second state, said means causes the third switch to remain closed for a first predetermined amount of time, then to open for a second predetermined amount of time, and then to close.

9. The output driver circuit according to claim 8, wherein the means for controlling the third switch is a ore-shot circuit.

10. The output driver circuit according to claim 9, wherein the one-shot circuit comprises a NAND gate having a first input terminal directly connected to receive the control signal, and a second input terminal connected to receive the control signal through an odd number of series-connected inverters.

11. The output driver circuit according to claim 10, wherein the odd number of series-connected inverters comprises three series-connected inverters.

12. The output driver circuit according to claim 8 further comprising:

a fourth switch having a first terminal connected to said first voltage source and having a second terminal and a gate;

a fifth switch having a first terminal connected to said second terminal of said fourth switch, having a second terminal connected to said output pad and having a gate; and means for controlling said fourth and fifth switches from said output signal and a user programmable circuit.

13. The output driver circuit according to claim 12 wherein:

said means for controlling said fourth switch is responsive to said control signal; and said means for controlling said fifth switch comprises a delay circuit.

14. The output driver circuit according to claim 12 wherein:

said means for controlling said fourth switch comprises a delay circuit; and said means for controlling said fifth switch is responsive to said control signal.

15. A method for changing a voltage level applied to an output pad of an integrated circuit device from a first voltage level to a second voltage level in response to a control signal, the method comprising:

connecting the output pad to a voltage source maintained at the second voltage level via both a first path and a second path, the first path passing through a first switch connected between the output pad and the voltage source, and the second path passing through a second switch and a third switch which are connected in series between the output pad and the voltage source, wherein connection of the output pad to the voltage source via both the first path and the second path causes the voltage level of the output pad to change at a first rate;

opening the third switch before the voltage level applied to the output pad reaches the second voltage level such that the output pad is connected to the voltage source only via the first path, wherein connection of the output pad to the voltage source via only the first path causes the voltage level of the output pad to change at a second rate, the second rate being lower than the first rate; and closing the third switch after a predetermined amount of time such that the output pad is connected to the voltage source via both the first path and the second path.

16. The method according to claim 15, wherein the second rate is one half of the first rate.

* * * * *